Feb. 5, 1957 C. W. HEWLETT 2,780,569

METHOD OF MAKING P-N JUNCTION SEMICONDUCTOR UNITS

Filed Aug. 20, 1952

Inventor:
Clarence W. Hewlett,
by Paul A. Frank
His Attorney.

2,780,569

METHOD OF MAKING P-N JUNCTION SEMICONDUCTOR UNITS

Clarence W. Hewlett, Marblehead, Mass., assignor to General Electric Company, a corporation of New York Application August 20, 1952, Serial No. 305,446

2 Claims. (Cl. 148—1.5)

Figure 1:
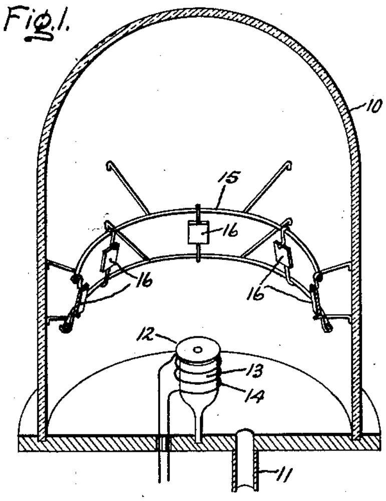

The invention relates to semiconductor bodies called "P–N junction units" having a region of positive conductivity adjoining a region of negative conductivity and forming between these regions an electrical space charge barrier known as a "P–N junction."

Semiconductors, such as germanium and silicon, are materials whose electric conductivity lies between the poor conductivity of "insulators" and the excellent conductivity of certain metallic "conductors." Conduction in semiconductors is primarily electronic; the conduction carriers being either electrons or electron vacancies (positive "holes") produced by the movement of electrons. The conductivity of semiconductors is greatly affected by changes in temperature and by impurities found in the semiconductor.

More specifically, semiconductors have become conventionally classified as either positive (P-type), negative (N-type), or intrinsic (neither positive nor negative), depending primarily upon the type and sign of their predominant conduction carriers. With P-type semiconductors, the direction of rectification as well as the polarity of a thermoelectric or Hall effect voltage are all opposite to that produced with N-type semiconductor. It has been found that the determinant of whether a particular semiconductor exhibits N-type or P-type characteristics lies primarily in the type of impurity elements present in the semiconductor. Some impurity elements, termed "donors," usually having a higher valence than the semiconductor, function to furnish additional free electrons to the semiconductor so as to produce an electronic excess N-type semiconductor; while other impurity elements, termed "acceptors," usually having a lower valence than the semiconductor, function to absorb the electrons to create P-type semiconductor with an excess of "positive holes." Antimony, phosphorus, and arsenic, falling in group V of the periodic table, are examples of "donor" impurities producing N-type germanium or silicon semiconductor; while aluminum, gallium, and indium, falling in group III of the periodic table, as well as zinc, are examples of "acceptor" impurities producing P-type germanium or silicon semiconductor. Donor and acceptor impurity elements are hereinafter referred to as electrically "significant" impurities while other elements electrically neutral to semiconductors are referred to as "neutral" impurities. Tin and gold are examples of neutral impurities which combine readily with germanium and silicon. Only minute amounts of the electrically significant impurity elements are normally necessary to produce marked electrical characteristics of one type or the other. Concentrations of some electrically significant impurities of less than one part per million may be sufficient.

It has been known for some time that if a substantially pure semiconductor ingot is prepared by solidification from a melt, the ingot may contain adjoining regions of P-type and N-type semiconductors with an intermediate rectifying barrier layer called a "P–N junction." When a piece of semiconductor bisected by this P–N junction is cut out of the ingot, the resulting P–N junction unit is found to possess marked rectifying, photoresponsive and thermoresponsive properties. Electric currents may be passed easily in only one direction through the junction and may be generated or modified by light or heat concentrated upon the junction.

More recently, it has been found that multiple P–N junction units having a region of one conductivity type between two regions of opposite conductivity type can be used in a three-terminal device known as a "transistor" to produce voltage, current, and power amplification. Such multiple junction units have become known as "N–P–N" or "P–N–P" units in accord with the distribution of their conductivity type regions.

In most methods heretofore employed to provide P–N junction units, an entire ingot containing one or two P–N junctions is produced and a number of small P–N junction units are extracted from the portion of this ingot bordering the P–N junction. Relatively few methods have been provided for directly and individually making P–N junction units from small, pre-formed or pre-cut semiconductor bodies. Accordingly, an important object of the invention is to provide improved and simplified methods for individually making small P–N junction units containing one or more P–N junctions.

In the copending application of William C. Dunlap, Serial No. 187,490, filed September 29, 1950, now abandoned, there is disclosed a method for individually making such single or multiple junction units suitable for use in asymmetrically conductive devices, thermoresponsive devices, photoresponsive devices, and transistors. The method of this Dunlap application is to deposit upon the surface of a semiconductor body having a predominance of conduction carriers of one polarity an electrically significant impurity element capable of inducing in the semiconductor conduction carriers of opposite polarity; and then to heat the unit until an impregnation and diffusion of the impurity element to a limited depth within the semiconductor body is accomplished. The region of the semiconductor impregnated with the significant impurity element by this heating step becomes converted thereby to a conductivity type opposite to that of the remaining unimpregnated region, and a P–N junction is thus formed between the two resulting opposite conductivity regions.

While this impurity diffusion method has proved highly successful in producing excellent quality P–N junction units, certain problems are encountered in its actual practice. The heating step must be accurately controlled since heating for too long a time or at too high a temperature causes an impurity impregnation of the entire semiconductor body. In addition, the exact depth and impurity concentration characteristics at the junction are somewhat difficult to determine and control since the location and composition of the junction varies as the impurity impregnation and diffusion proceeds. Moreover, the entire semiconductor body must be elevated in temperature to a temperature (usually above 500° C.) at which impurity impregnation and diffusion occur. It has been found in some cases, especially where the semiconductor body is raised to temperatures close to the melting point of the semiconductor involved, that temperature strains are introduced in the semiconductor body and tend to impair the useful rectifying and other electrical properties of the resulting P–N junction unit.

Accordingly, another object of the invention is to provide a method for producing in a semiconductor P–N junctions whose location and impurity concentration can be easily and accurately controlled. Another object is to provide a method for directly and simultaneously producing a plurality of individual P–N junction units. A further object of the invention is to provide a method for producing individual semiconductor P–N junction units in which the semiconductor body need not be subjected to a predetermined heating step. A further object is to provide a method for making P–N junction units in which a region of one conductivity type may constitute a very thin semiconductor film providing substantially no impedance to radiant energy. A still further object is to provide semiconductor P–N junction units having excellent and improved rectifying, photoresponsive and thermoresponsive characteristics; and to provide methods for consistently and reproducibly making such P–N junction units.

In accord with the invention, a vapor of the semiconductor mixed with a vapor of a signficant impurity element capable of inducing conduction carriers of one polarity is deposited and condensed to a solid upon a surface portion of a solid, monocrystalline semiconductor body having a predominance of conduction carriers of an opposite polarity. In other words, if the solid monocrystalline semiconductor body is N-type, the vapor deposit consists of a semiconductor and an acceptor impurity; while if the solid monocrystalline semiconductor body is P-type, the vapor deposit consists of a semiconductor and a donor impurity. The P–N junction is formed at the surface of the monocrystalline semiconductor body immediately beneath the vapor-deposited layer. The vapor-deposited layer may be deposited to any desired thickness since a P–N junction is formed even with extremely thin vapor-deposited films such as, for example, films less than a few microns thick. The vapor-deposited semiconductor alloy appears as an amorphous or finely divided crystalline layer upon the surface of the monocrystalline semiconductor body and has a dark non-reflecting appearance contrasting to the bright and highly reflective surface of pure germanium and silicon semiconductor bodies.

Photoresponsive and thermoresponsive devices may be made from the resulting P–N junction units by connecting one electrode to the monocrystalline semiconductor body and a second electrode to the vapor-deposited semiconductor layer in a manner such as to admit radiant energy to pass through such vapor-deposited layer and to impinge upon the internal P–N junction. For this purpose, the vapor-deposited layer is preferably made extremely thin, for example, a thickness of the order of a few microns.

In making rectifiers from such P–N junction units, electrodes are respectively connected in any suitable manner to the monocrystalline semiconductor body and to the vapor-deposited layer.

In making transistors, two semiconductor layer regions of one conductivity type are vapor deposited upon the surface of a solid semiconductor body of opposite conductivity type. Electrodes are then connected to each of the vapor-deposited regions and to the solid semiconductor body.

Figures 2, 3:
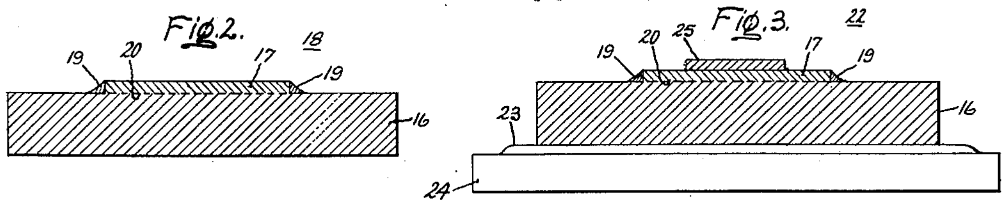
Figure 4:
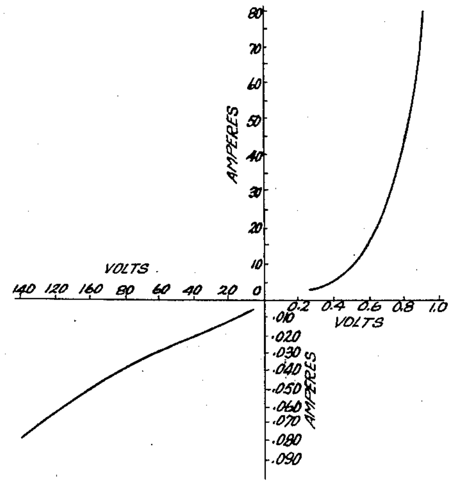
Figure 5:
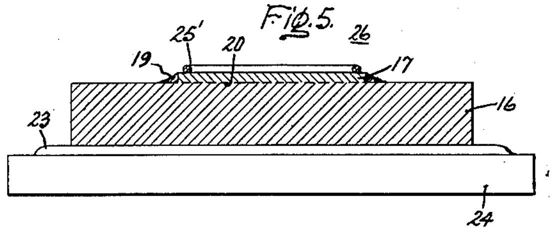
Figure 6:
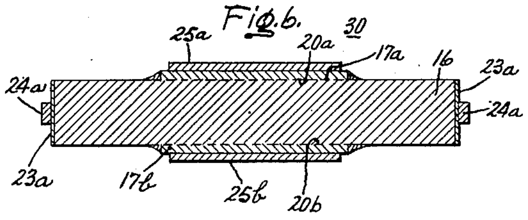

The novel features which are believed characteristic of the invention are set forth in the appended claims. The invention itself, however, together with further objects and advantages thereof, can best be understood by referring to the following detailed description taken in connection with the accompanying drawing in which Fig. 1 is a side perspective view, partly in section, of apparatus such as may be employed in practicing the method of the invention; Fig. 2 is a cross-sectional view of a P–N junction unit made in accord with the invention; Fig. 3 is a rectifier embodying the invention; Fig. 4 is a typical voltage vs. current curve of a rectifier, such as illustrated by Fig. 3; Fig. 5 is a photocell embodying the invention; and Fig. 6 is a transistor embodying the invention.

Referring to Fig. 1, there is shown a typical vacuum deposit apparatus comprising a vacuum chamber 10 having an exhausting outlet 11 and containing an evaporator 12 which may conveniently be a quartz or berryllium oxide crucible 13 surrounded by an electric heating element 14 which enables the material within crucible 13 to be heated to any desired temperature. A wire frame 15 is arranged to support a number of small semiconductor wafers 16 arranged to receive on one surface the vapor stream emitted from the material within evaporator 12. Each wafer 16 is the same distance from evaporator 12 and in the same angular relation to a vapor stream emitted from evaporator 12.

Wafer 16, shown in detail in Fig. 2, is a solid monocrystalline semiconductor body preferably rectangular and of relatively small dimensions. Wafer 16 may, for example, conveniently have length and width dimensions about 0.50 inch and a thickness dimension about 0.020 inch. Wafer 16 may have positive or negative conduction characteristics and preferably consists of germanium or silicon free of all impurities other than the significant acceptor or donor impurity which determines its desired conduction characteristics. Wafer 16 may, for example, be extracted from an ingot grown by seed crystal withdrawal from a melt consisting of the semiconductor and a trace of a donor impurity such as antimony, arsenic, or phosphorus. In this case, the extracted wafer 16 has N-type conduction characteristics. Alternatively, wafer 16 may be extracted from an ingot grown by seed crystal withdrawal from a melt consisting of the semiconductor and a trace of an acceptor impurity such as indium, gallium, or aluminum, in which case the extracted ingot is P-type. Only small traces usually less than .05% of the selected significant impurity are normally included in the melt in order that the resultant wafer 16 will have a resistivity above 1 ohm centimeter.

The surface of the semiconductor wafer 16 that is to be coated must be perfectly clean and, to that end, is preferably polished smooth and etched by any suitable chemical etchant. A mixed acid etch consisting of 1 part concentrated hydrofluoric acid to 4 parts concentrated nitric acid is quite suitable.

The material which is evaporated from evaporator 12 and which is deposited as a coating or layer 17 upon the etched surface of semiconductor wafer 16 consists of a semiconductor material together with a significant impurity element capable of including conduction carriers opposite in polarity to the predominant conduction carriers in wafer 16. If, for example, semiconductor wafer 16 constitutes P-type germanium, then the vapor-deposited layer 17 consists of germanium or silicon and a donor impurity element such as antimony, arsenic, or phosphorus. If semiconductor wafer 16 constitutes N-type germanium, then layer 17 consists of germanium or silicon and an acceptor impurity element such as indium, gallium, or aluminum. Similarly, if semiconductor wafer 16 constitutes P-type silicon, then layer 17 consists of germanium or silicon and a donor impurity; while if semiconductor wafer 16 constitutes N-type silicon, then layer 17 consists of germanium or silicon and an acceptor impurity element.

The amount of significant donor or acceptor impurity element included in the vapors to be deposited upon the surface of wafer 16 is not critical. Even minute traces of these significant impurity elements are sufficient to produce a deposited coating or layer 17 which is strongly P-type or N-type, depending upon the nature of the significant impurity employed. It will be appreciated, because of the high volatility of some significant impurities such as arsenic, that these impurity elements may need to be evaporated separately from the semiconductor, and layer 17 produced by co-deposition of the mixed vapors. As is well known in vapor-depositing techniques, it is not necessary that the material to be evaporated be initially in the form of an alloy so long as a mixture of the vapors of the semiconductor and the significant impurity element is produced in the evacuated chamber 10 and a coating of both vapors is simultaneously deposited upon the surface of wafer 16.

The surface of wafer 16 that is exposed to the vapor stream may be partially masked by any suitable insulating means (not shown) to produce a deposited layer having any desired configuration. In Fig. 2, the deposited layer 17 is shown as covering a circular area in the center of the exposed major surface of wafer 16. The thickness of layer 17 may be controlled by the time during which wafer 16 is exposed to the vapor stream. After a layer of desired thickness is deposited, the power to heating element 14 is shut off and the resultant coated wafer 18 is cooled and removed. The temperature of wafer 16 upon receiving the vapor deposition is not critical, but may conveniently be anywhere from room temperature up to 750° C. So long as wafer 16 is more than a few centimeters away from evaporator 12, no provision need be made for controlling its temperature.

The deposited layer 17 is amorphous or finely crystalline in character, and dark and non-reflecting in appearance. This is to be contrasted with the shiny, metallic, highly reflective surface appearance of monocrystalline semiconductor bodies such as constitute wafer 16. The deposited layer tends to be amorphous if deposited at a low temperature, less, for example, than 350° C. while it tends to be finely crystalline if deposited at a higher temperature.

The P–N junction 20 of the resulting P–N junction unit 18 is formed at the former surface of wafer 16 immediately beneath deposited layer 17. Due to the uniformity of the coating which results from the vapor deposition process, P–N junction 20 has uniform electrical characteristics throughout its area. This is particularly true if wafer 16 is a monocrystalline semiconductor body since the actual space charge barrier at the junction is of the order of microns in thickness and any crystal grain boundaries tend to destroy the uniformity of the deposited barrier layer.

After P–N junction unit 18 is removed from the vacuum chamber, lacquer 19 or other insulating material is preferably painted over the exposed edge of P–N junction 20 where the deposited layer 17 meets the surface of the wafer 16. This prevents short-circuiting across junction 20 as a result of any electrically conducting particles which may fall upon the surface of unit 18 and provides some atmospheric protection of the exposed junction.

The suitability of P–N junction unit 18 for its destined purpose depends to a large extent upon the significant impurity concentration gradient across and immediately bordering the P–N junction 20. This impurity concentration gradient is determined by the amount of conduction carrier inducing impurity of one polarity type in the semiconductor wafer 16 relative to the amount of conduction carrier inducing impurity of opposite polarity type in the deposited semiconductor layer 17. The amount of significant impurity included in wafer 16 can be controlled by the ratio of such impurity element to semiconductor included in the melt from which the monocrystalline ingot is grown, and from which wafer 16 is extracted. The significant impurity content in deposited layer 17 can also be easily controlled by the ratio of impurity vapor relative to the ratio of semiconductor vapor in the vapor stream emanating from evaporator 12 and deposited as layer 17 upon wafer 16.

A typical P–N junction unit 18 is made in accord with the above-described technique as follows. A monocrystalline N-type germanium wafer corresponding to wafer 16 and having length and width dimensions approximately 0.50 inch and a thickness dimension about 0.020 inch is extracted from an ingot (not shown) grown from a melt consisting of substantially pure N or P-type germanium having a resistivity about 1 ohm centimeter and a trace, usually much less than 1%, of antimony. Even this small amount of antimony insures that the resulting grown ingot is strongly N-type in character. This major surfaces of this N-type wafer are polished smooth and etched in the above-mentioned mixed acid etch. The periphery of one major surface of the N-type germanium wafer is masked with a thin sheet of mica (not shown) to expose to the vapor stream from evaporator 12 a central circular surface area about 1 centimeter in diameter. The wafer is mounted about 3 centimeters above the opening in evaporator 12. A 5 milligram body of indium is placed in the bottom of crucible 13, and on top of this indium body a 500 milligram body of substantially pure germanium is placed. The vacuum in chamber 10 is adjusted to less than 0.1 micron pressure, and sufficient power, for example, 250 watts, is supplied to heating element 14 to raise the temperature of the material within evaporator 12, for example, to 1100° C. After about 2 minutes, the vapor-deposited layer suddenly begins to appear upon the surface of the wafer 16. The evaporation is continued for about 2 minutes more, and then the power to heating element 14 is removed. Wafer 16 is allowed to cool and is then removed from vacuum chamber 10. Lacquer 19 is then painted around the edge of deposit layer 17. The deposited layer 17 is found to weigh about 1 milligram and have a thickness of about 2 microns.

Referring now to Fig. 3, there is shown a rectifier 22 embodying a P–N junction unit 18 made in accord with the invention. Semiconductor wafer 16 is connected by an electrically conducting solder 23 to a metallic plate 24 which constitutes one electrode of the rectifier. Plate 24 may conveniently be composed of fernico which has a thermal coefficient of expansion similar to semiconductor wafer 16. If wafer 16 constitutes an N-type semiconductor, solder 23 may comprise a neutral impurity element or a donor impurity element, such as antimony, but should not comprise an acceptor impurity element. Conversely, if wafer 16 is a P-type semiconductor, solder 23 may comprise a neutral impurity element or an acceptor impurity, such as indium, but should not comprise a donor impurity element. Plate 24 may be attached to semiconductor wafer 16 either before or after the semiconductor layer 17 is vapor deposited thereon. A second electrically conducting metal, constituting the remaining electrode of rectifier 22, is then connected by any suitable means such as by vapor deposition to the previously vapor-deposited semiconductor layer 17. This second electrode 25 may conveniently be copper, gold, or silver. If the deposited semiconductor layer 17 is P-type, electrode 25 may also comprise an acceptor impurity, such as indium or aluminum, but should not comprise a donor impurity. Conversely, if deposited semiconductor layer 17 is N-type, the electrode 25 may also comprise a donor impurity, such as antimony, but should not comprise an acceptor impurity. A rectifier such as rectifier 22 using an N-type monocrystalline germanium wafer 16 of 15 ohm-centimeter resistivity having a fernico plate 24 connected to wafer 16 by an antimony solder 23, and having a P–N junction area of 1.25 square centimeters, has been found to pass over 80 amperes at one volt in the easy-flow direction and to withstand over 150 volts in the reverse direction with a leakage current less than 100 milliamperes. A typical volt-ampere curve in both the forward and reverse directions for such a high power rectifier is shown in Fig. 4. It will be appreciated that this high power rectifier must be water-cooled or air-cooled in order that it may carry such heavy currents without excessive temperature rise.

Referring now to Fig. 5, there is shown a photocell 26 constructed from a P–N junction unit made in accord with the invention. Photocell 26 is made in the identical manner as rectifier 22 with the exception that an annular electrode 25′ replaces the disk electrode 25. Light may thus pass through the center of annular electrode 25′ to pass through vapor-deposited semiconductor layer 17 and to impinge upon the P–N junction 20 immediately beneath layer 17. It will be appreciated that semiconductor layer 17 should be deposited as a very thin film of a few, preferably less than 10, microns thickness in order that the layer will be substantially transparent to incident light and small compared with the diffusion distance of the photo-induced carriers. A greater proportion of incident light reaches P–N junction 20 through these extremely thin films than that reaching the junction through thicker semiconductor regions provided by prior methods of producing P–N junction units. Such extremely thin vapor-deposited semiconductor films 17 also enable a better response to the shorter wave lengths of white light, such as wave lengths approaching the ultraviolet, despite the high absorption coefficient of germanium and silicon semiconductors. Photocell 26 may thus be employed to detect variations in the intensity of light having wave lengths including the ultraviolet, while prior germanium and silicon P–N junction photocells have generally found utility only in detecting light of fairly long wave lengths approaching and including the infrared.

Referring now to Fig. 6, there is shown a transistor 30 constructed in accord with the invention. In transistor 30, semiconductor layers **17*a* and 17*b* are deposited directly opposing each other on the central portions of the opposite major surfaces of semiconductor wafer 16. Vapor-deposited layers 17*a* and 17*b* are preferably identical in composition and may be vapor deposited from the same evaporate. Two electrically conductive electrodes 25*a* and 25*b*, called "emitter" and "collector" electrodes respectively and similar to electrode 25 of the Fig. 3, are respectively connected to vapor-deposited layers 17*a* and 17*b*. A third electrode 24*a*, similar to electrode 24 of Fig. 3, is connected around the periphery of wafer 16 by such means as an electrically-conducting solder 233*a*. Wafer 16 may constitute N-type or P-type semiconductor. If wafer 16 constitutes N-type germanium, deposited layers 17*a* and 17*b* comprise germanium with an acceptor impurity element, while if wafer 16 constitutes P-type germanium, vapor-deposited layers 17*a* and 17*b* comprise germanium with a donor impurity element. Two P–N junctions 20*a* and 20*b* are thus produced between the respective adjoining N-type and P-type regions of transistor 30. One P–N junction such as junction 20*a* constitutes the "emitter" junction of transistor 30, while the other P–N junction 20*b* constitutes the "collector" junction of transistor 30. In the well-known operation of a transistor, such as the N–P–N or P–N–P transistor 30, a small change in current between emitter electrode 25*a* and base electrode 24*a* with the emitter electrode 25*a* biased in the easy-flow direction relative to base electrode 24*a* produces a much larger change in current between collector electrode 25*b* and base electrode 24*a* with the collector electrode 25*b* biased in the difficult-flow direction relative to base electrode 24*a***.

It will thus be seen that I have provided a simple but highly efficient method for individually producing single or multiple P–N junction units suitable for many purposes. The P–N unit need not be subjected to any predetermined heating cycle. Since the semiconductor layer 17 is vapor deposited upon wafer 16 while the wafer is at a temperature considerably below the melting point of the semiconductor involved, no temperature strain of the resulting unit occurs. The uniformity of the semiconductor layer 17 resulting from the vapor-deposition process insures the production of uniform, high-quality P–N junctions 20 in the resulting unit. The thickness of the deposited layer is easily controllable even to an extremely thin film, enabling the production of improved photosensitive and thermosensitive units. The P–N junction itself may be easily located since it is always formed immediately beneath the vapor-deposited layer 17 at the interface between layer 17 and the surface of wafer 16. Moreover, the concentration and gradient of impurities bordering and across the P–N junction can be easily controlled and determined by the percentage of significant impurities included in the semiconductor wafer 16 and in the vapors from which layer 17 is deposited.

Although I have described particular devices and methods embodying the invention, many modifications can be made; and I intend by the appended claims to cover all such modifications and claims which fall within the true spirit and scope of the invention.

What I claim as new and desire to secure by Letters Patent of the United States:

1. The method of making P–N junction units, which method comprises preparing a monocrystalline body comprising germanium alloyed with a trace of a donor impurity element for germanium, locating the body in an evacuated chamber, generating in said evacuated chamber by evaporation a vapor of germanium mixed with a vapor of an acceptor impurity element for germanium, and condensing said mixed vapors to a solid layer upon a surface portion of said body.

2. The method of making P–N junction units, which method comprises preparing a monocrystalline body comprising germanium alloyed with a trace of an acceptor impurity element for germanium, locating the body in an evacuated chamber, generating in said evacuated chamber by evaporation a vapor of germanium mixed with a vapor of a donor impurity element for germanium, and condensing said mixed vapors to a solid layer upon a surface portion of said body.

References Cited in the file of this patent

UNITED STATES PATENTS

| | | |
|---|---|---|
| 2,151,457 | Williams | Mar. 21, 1939 |
| 2,239,452 | Williams | Apr. 22, 1941 |
| 2,413,605 | Colbert et al. | Dec. 31, 1946 |
| 2,597,028 | Pfann | May 20, 1952 |
| 2,623,102 | Shockley | Dec. 23, 1952 |
| 2,629,672 | Sparks | Feb. 24, 1953 |
| 2,692,839 | Christensen | Oct. 26, 1954 |
| 2,695,852 | Sparks | Nov. 30, 1954 |
| 2,701,216 | Seiler | Feb. 1, 1955 |